(12) United States Patent
Ogawa

(10) Patent No.: US 11,075,099 B2
(45) Date of Patent: Jul. 27, 2021

(54) SUBSTRATE STORAGE CONTAINER

(71) Applicant: Shin-Etsu Polymer Co., Ltd., Tokyo (JP)

(72) Inventor: Osamu Ogawa, Saitama (JP)

(73) Assignee: Shin-Etsu Polymer Co., Ltd., Tokyo (JP)

(*) Notice: Subject to any disclaimer, the term of this patent is extended or adjusted under 35 U.S.C. 154(b) by 0 days.

(21) Appl. No.: 16/977,479

(22) PCT Filed: Mar. 1, 2019

(86) PCT No.: PCT/JP2019/008005
§ 371 (c)(1),
(2) Date: Sep. 2, 2020

(87) PCT Pub. No.: WO2019/176581
PCT Pub. Date: Sep. 19, 2019

(65) Prior Publication Data
US 2021/0005492 A1    Jan. 7, 2021

(30) Foreign Application Priority Data

Mar. 13, 2018    (JP) .............................. JP2018-045064

(51) Int. Cl.
*B65D 85/48*    (2006.01)
*H01L 21/673*    (2006.01)
(Continued)

(52) U.S. Cl.
CPC .... *H01L 21/67389* (2013.01); *B65D 81/2076* (2013.01); *B65D 85/30* (2013.01)

(58) Field of Classification Search
CPC .... B65D 81/2076; B65D 85/30; B65D 85/48; H01L 21/673; H01L 21/67389; H01L 21/67393
(Continued)

(56) References Cited

U.S. PATENT DOCUMENTS 6,732,877 B2 * 5/2004 Wu ..................... B65D 51/1616
206/710
8,403,143 B2 * 3/2013 Chiu ................. H01L 21/67353
206/454
(Continued)

FOREIGN PATENT DOCUMENTS

JP        S50103229        8/1975
JP        H1089035         4/1998
(Continued)

OTHER PUBLICATIONS

"International Search Report (Form PCT/ISA/210) of PCT/JP2019/008005," dated May 28, 2019, with English translation thereof, pp. 1-4.

*Primary Examiner* — Luan K Bui
(74) *Attorney, Agent, or Firm* — JCIP Global Inc.

(57) ABSTRACT

Provided is a substrate storage container including a valve(s) capable of controlling flow of gas without using a metallic member. The valve(s) are attached to a substrate storage container and include: a cylindrical body having an open edge and an interior space; a stopcock portion partitioning the interior space into a first space and a second space and extending to the open edge; and an elastic body covering the open edge and the stopcock portion. The first space has a first communication hole communicating with an outside of the container body. The second space has a second communication hole communicating with an inside of the container body. The elastic body controls flow of gas relative to the container body by closely contacting the stopcock portion or separating from the stopcock portion.

9 Claims, 6 Drawing Sheets

(51) Int. Cl.
*B65D 81/20* (2006.01)
*B65D 85/30* (2006.01)

(58) Field of Classification Search
USPC .............................. 206/454, 710, 711, 832
See application file for complete search history.

(56) References Cited

U.S. PATENT DOCUMENTS

| | | | | |
|---|---|---|---|---|
| 2005/0257839 | A1* | 11/2005 | Kaneko | F16K 24/04 137/587 |
| 2009/0266441 | A1* | 10/2009 | Sato | F16K 15/063 141/63 |
| 2010/0163452 | A1* | 7/2010 | Lin | H01L 21/67393 206/711 |

FOREIGN PATENT DOCUMENTS

| | | |
|---|---|---|
| JP | 2002364766 | 12/2002 |
| JP | 2004179449 | 6/2004 |
| JP | 2008066330 | 3/2008 |
| JP | 2009277687 | 11/2009 |

\* cited by examiner

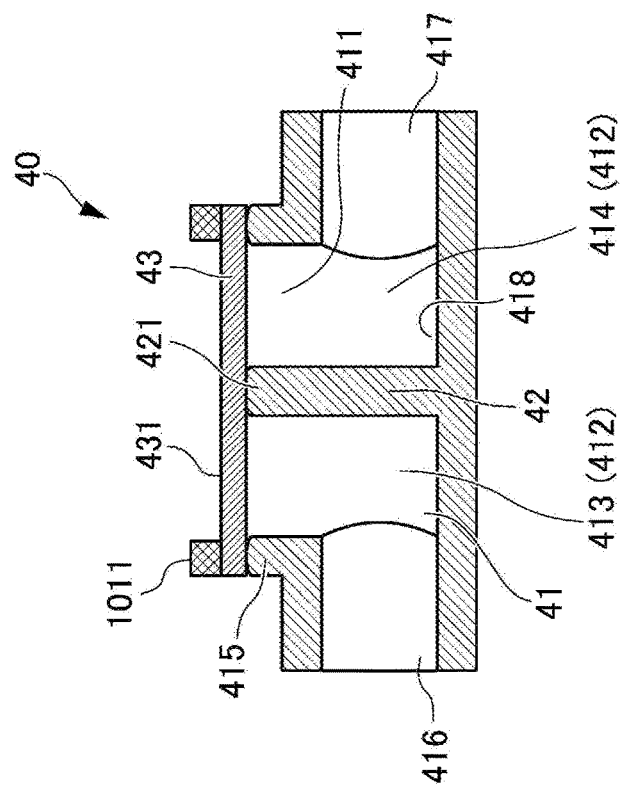
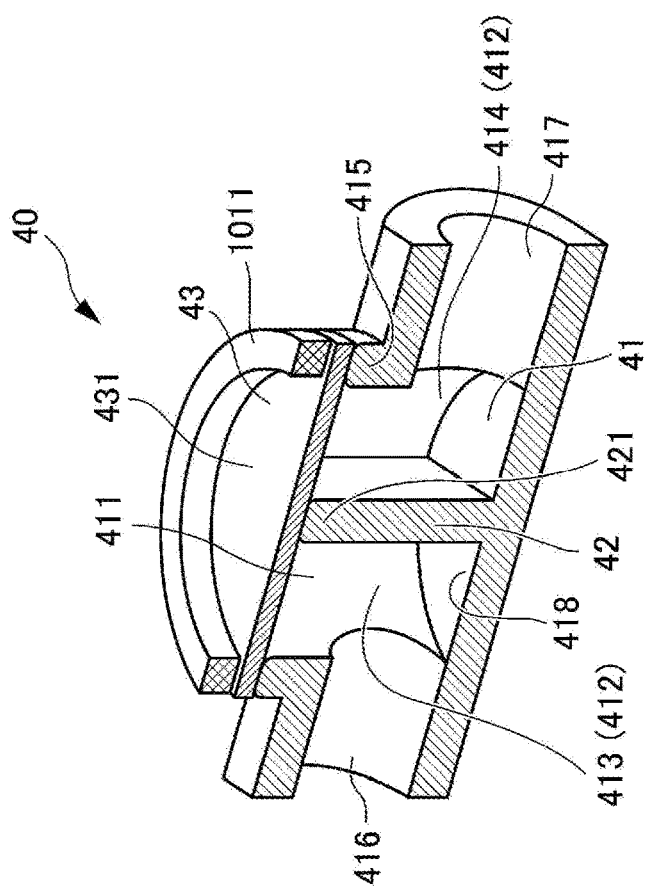
FIG. 3B
FIG. 3A

SUBSTRATE STORAGE CONTAINER

CROSS-REFERENCE TO RELATED APPLICATION

This application is a 371 application of the international PCT application serial no. PCT/JP2019/008005, filed on Mar. 1, 2019, which claims the priority benefits of Japan application no. 2018-045064, filed on Mar. 13, 2018. The entirety of each of the above-mentioned patent applications is hereby incorporated by reference herein and made a part of this specification.

TECHNICAL FIELD

The present disclosure relates to a substrate storage container with a valve(s) for controlling flow of gas relative to the container body.

BACKGROUND ART

Substrate storage containers for containing substrates comprise a container body, a lid for closing and opening of the container body and valves for controlling flow of gas relative to the container body. The valves have a check valve function and include a valve body and a metallic elastic member for opening and closing the valve body (for example, see Patent Documents 1 and 2).

Since the check valve function of the valves controls flow of gas in one direction, usually the valves themselves are replaced or the valve bodies and the elastic members are re-assembled according to the direction of the flow of gas.

CITATION LIST

Patent Literature

[Patent Literature 1] International Publication No. 2008/066330

[Patent Literature 2] International Publication No. 2004/179449

SUMMARY OF INVENTION

Technical Problem

For storing a substrate airtightly, gas is supplied to the substrate storage container from the valves and exhausted via the valves. When processing the stored substrate, residual materials adhered to the substrate are sometimes exhausted together with the supplied gas. For this reason, metallic elastic members and the like of the valves could be corroded by the residual materials.

The present disclosure has been made in view of the above problems. It is an object of the present disclosure to provide a substrate storage container comprising a valve(s) capable of controlling gas flow without using a metallic member.

It is also an object of the present disclosure to provide a substrate storage container comprising a valve(s) capable of controlling bidirectional gas flow for supplying or exhausting the gas.

Solution to Problem (1) One aspect of the present disclosure is a substrate storage container that includes: a container body for storing a substrate; a lid for closing an opening of the container body; and a valve for controlling flow of gas relative to the container body. The valve has: a cylindrical body having an open edge and an interior space; a stopcock portion partitioning the interior space into a first space and a second space and extending to the open edge; and an elastic body covering the open edge and the stopcock portion. The first space has a first communication hole communicating with an outside of the container body, and the second space has a second communication hole communicating with an inside of the container body. The elastic body controls the flow of the gas relative to the container body by closely contacting the stopcock portion or separating from the stopcock portion.

(2) In the above aspect (1), the elastic body may have a plate-like shape and may seal between the open edge above the first space and the stopcock portion and between the stopcock portion and the open edge above the second space so that the gas flows only through the first space and the second space.

(3) In the above aspect (1) or (2), the elastic body may enable the flow of the gas relative to the container body by bulging to form a clearance against the stopcock portion when positive pressure is applied to the first space or the second space, and may block the flow of the gas relative to the container body by closely contacting the stopcock portion when the positive pressure is not applied to the first space and the second space.

(4) In any one of the above aspects (1) to (3), the elastic body may be detachably attached to the cylindrical body.

(5) In any one of (1) to (4) above, the valve may be attached in a midway of a gas flow passage provided to the container body.

(6) In any one of the above aspects (1) to (4), the first communication hole may communicate with a fixation cylinder fitted in a through hole formed in the container body, and the second communication hole may communicate with a holding cylinder combined with the fixation cylinder.

(7) In any one of the above aspects (1) to (4), the first communication hole may communicate with a fixation cylinder fitted in a through hole formed in the container body, and the second communication hole may communicate with an inner lid cylinder connected to a holding cylinder combined with the fixation cylinder.

(8) In the above aspect (6) or (7), the valve may have a filter for filtering the gas.

Advantageous Effects of Invention

According to the present disclosure, it is possible to provide a substrate storage container including a valve(s) capable of controlling flow of gas without using a metallic member.

BRIEF DESCRIPTION OF DRAWINGS

FIG. 3A is a cross-sectional perspective view showing a structure of the valve.

FIG. 3B is a cross-sectional view showing the structure of the valve.

DESCRIPTION OF EMBODIMENTS

Figure 1:
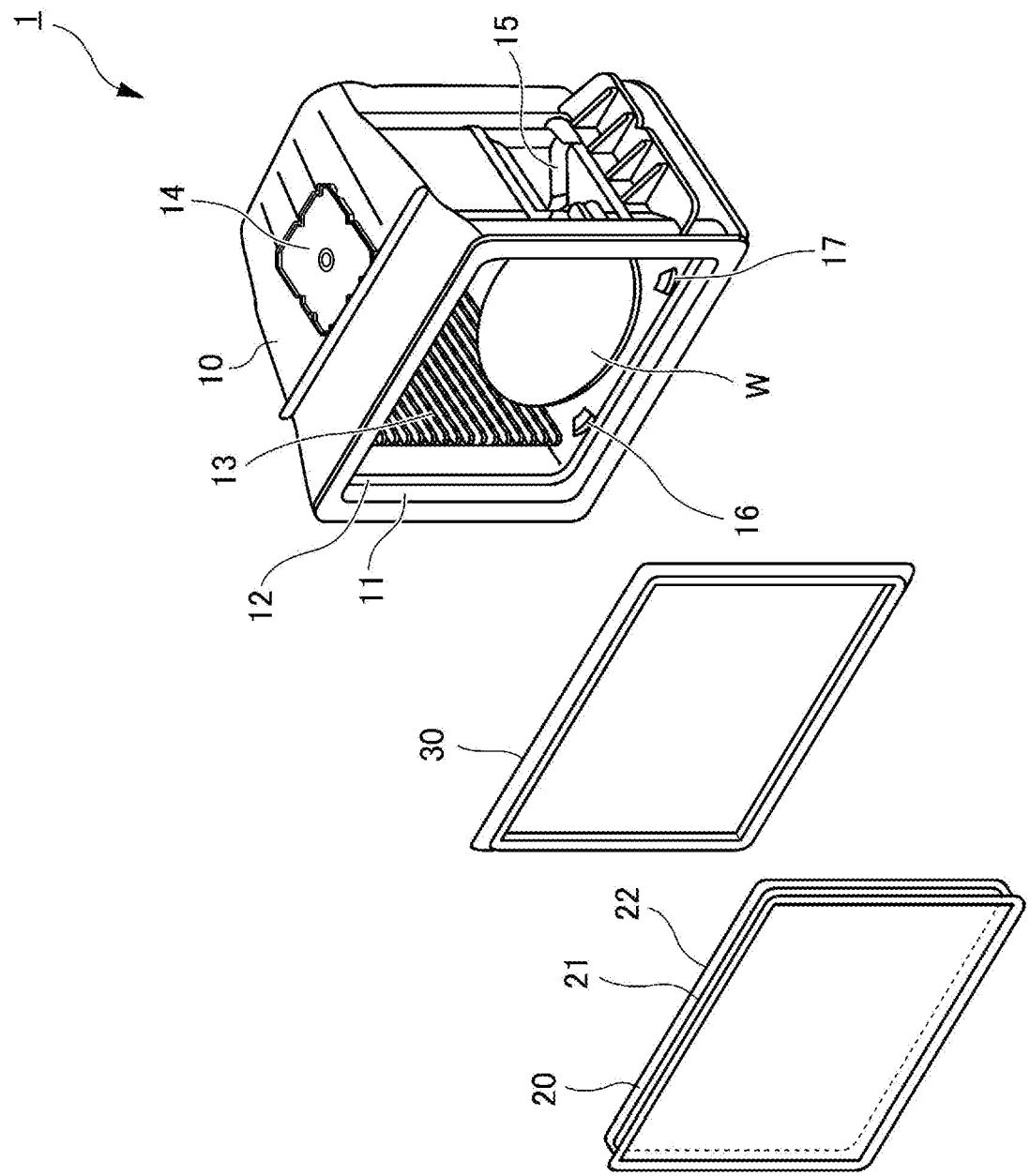
FIG. 1 is a schematic exploded perspective view showing a substrate storage container of an embodiment according to the present invention.

Hereinafter, embodiments of the present invention will be described in detail with reference to the drawings. Throughout the embodiments herein, the same members are denoted by the same reference numerals.

FIG. 1 is a schematic exploded perspective view showing a substrate storage container 1 of an embodiment according to the present invention.

As shown in FIG. 1, the substrate storage container 1 comprises: a container body 10 for storing a substrate W; a lid 20 for closing an opening 11 of the container body 10; and an annular packing 30 provided between the container body 10 and the lid 20.

The container body 10 is a box-like body and is a front open type having the opening 11 in front. The opening 11 is formed by bending with a step so as to extend outward. A surface of such stepped portion formed on an inner peripheral edge of the opening 11 in front is a seal face 12 to which the packing 30 contacts. The container body 10 is preferably of the front open type since it is easy to insert the substrate W having a diameter of 300 mm or 450 mm. However, the container body 10 may be of a bottom open type in which the opening 11 is formed in a lower surface.

Support bodies 13 are disposed on both right and left sides inside the container body 10. The support bodies 13 have a function of carrying and positioning the substrate W. Each support body 13 has multiple grooves formed in a height direction, constituting so-called groove teeth. The substrate W is placed on two groove teeth of the same height on the right and left. A material of the support bodies 13 may be the same as that of the container body 10, but a different material may be used to improve cleaning property and slidability.

A rear retainer (not shown) is disposed at the rear (back side) inside the container body 10. When the lid 20 is closed, the rear retainer holds the substrate W in a pair with a front retainer described later. However, unlike the present embodiment, the rear retainer may not be provided. The support bodies 13 may have, for example, substrate retaining portions having a "<" shape or a linear shape on the back side of the groove teeth, such that the substrate W is held by the front retainer and the substrate retaining portions. The support bodies 13 and the rear retainer are provided on the container body 10 by insert-molding, fitting and the like.

The substrate W is supported by the support bodies 13 and stored in the container body 10. An example of the substrate W is a silicon wafer. However, the substrate W is not particularly limited thereto and may be, for example, a quartz wafer, a gallium arsenide wafer and the like.

On a middle portion of a ceiling of the container body 10, a robotic flange 14 is detachably provided. A conveying robot in a factory grips the robotic flange 14 of the substrate storage container 1 in which the substrate W is airtightly stored in a clean condition, and conveys it to a processing device for each process for processing the substrate W.

Further, on middle portions of outer surfaces of both sides of the container body 10, manual handles 15 are detachably provided respectively, which are gripped by an operator.

Figure 2:
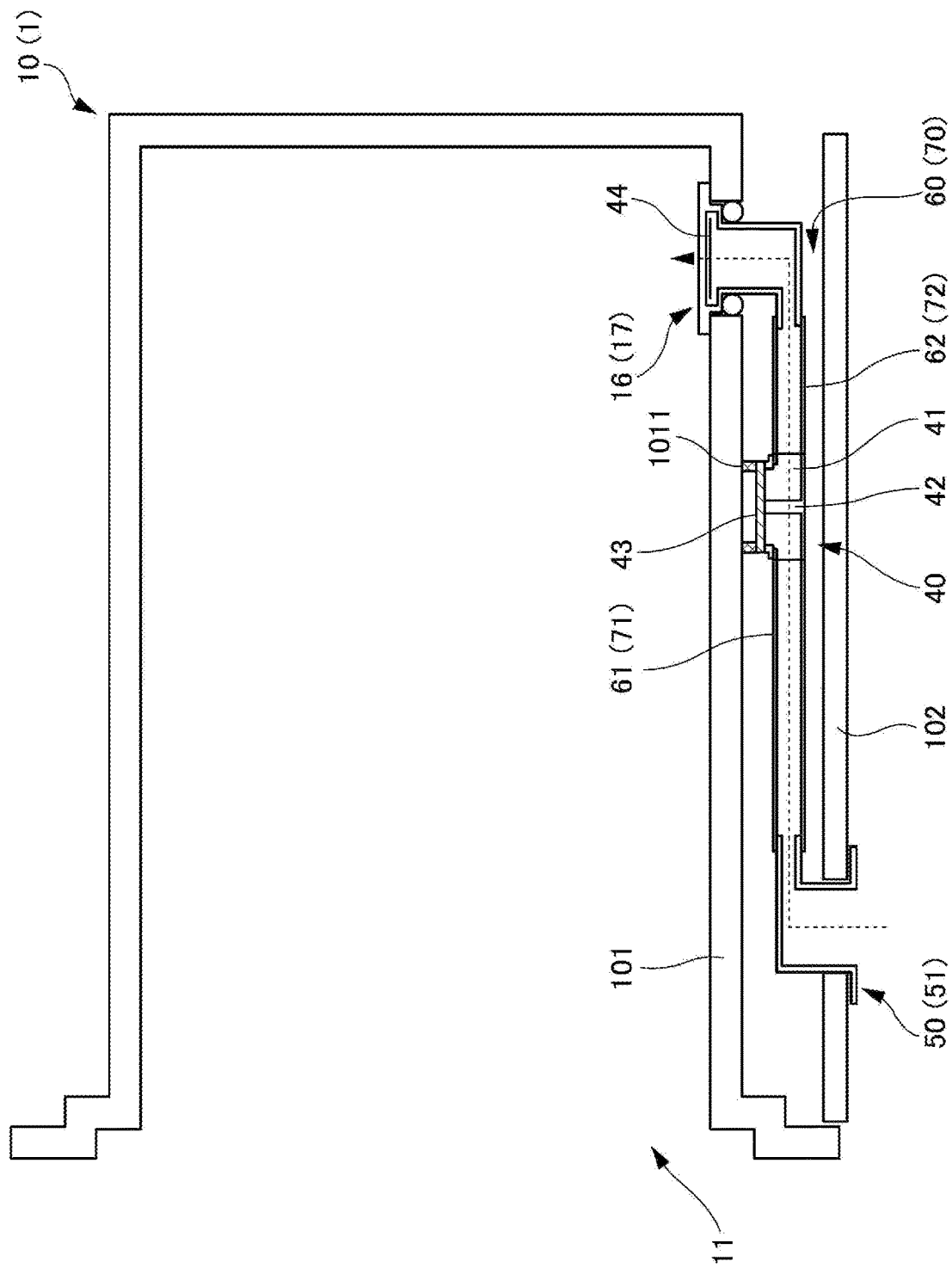
FIG. 2 is a schematic cross-sectional view showing a valve of a container body.

FIG. 2 is a schematic cross-sectional view showing a valve 40 of the container body 10.

As shown in FIG. 2, an air supply unit 16 and an air exhaust unit 17 are provided on an inner bottom surface portion 101 of the container body 10. In addition, a gas introduction portion 50 corresponding to the air supply unit 16 and a gas exhaust portion 51 corresponding to the air exhaust unit 17 are provided on an outer bottom plate 102 of the container body 10. The air supply unit 16 or the air exhaust unit 17 has a filter 44 for filtering gas.

Provided between the inner bottom surface portion 101 and the outer bottom plate 102 are an air supply flow passage 60 (gas flow passage) communicating the air supply unit 16 and the gas introduction portion 50 and an air exhaust flow passage 70 (gas flow passage) communicating the air exhaust unit 17 and the gas exhaust portion 51. Note that, the below-mentioned valve(s) 40 are attached in a midway of the air supply flow passage 60 and the air exhaust flow passage 70, which are gas flow passages (plumbing).

The air supply flow passage 60 has: a first air supply flow passage 61 communicating the gas introduction portion 50 and the valve 40; and a second air supply flow passage 62 communicating the air supply unit 16 and the valve 40. Similarly, the air exhaust flow passage 70 has: a first air exhaust flow passage 71 communicating the gas exhaust portion 51 and the valve 40; and a second air exhaust flow passage 72 communicating the air exhaust unit 17 and the valve 40.

Herein, each plumbing may be a pipe made of a resin having high rigidity or a tube having flexibility. The first air supply flow passage 61 or the first air exhaust flow passage 71, preferably the air supply flow passage 60 or the air exhaust flow passage 70, may be provided with the gas introduction portion 50 side or the gas exhaust portion 51 side lowered.

An inert gas such as nitrogen gas or dry air is supplied from the gas introduction portion 50 through the air supply flow passage 60 and the air supply unit 16 into the inside of the substrate storage container 1 closed by the lid 20. The gas is exhausted, as required, from the air exhaust unit 17 through the air exhaust flow passage 70 and the gas exhaust portion 51. Thereby, the gas inside the substrate storage container 1 is replaced; airtightness is kept with a low humidity; or impurity substances on the substrate W are blew away. Thus, the cleanliness inside the air supply unit 1 is maintained.

Further, by detecting the gas exhausted from the air exhaust unit 17, it is possible to confirm whether the inside of the substrate storage container 1 has been replaced with the introduced gas. The air supply unit 16 and the air exhaust unit 17 are preferably in a position deviated from the position of the substrate W projected on the bottom surface, but the numbers and positions of the air supply unit 16 and the air exhaust unit 17 are not limited to those shown. The air supply unit 16 and the air exhaust unit 17 may be located at the four corners of the bottom surface of the container body 10. The air supply unit 16 and the air exhaust unit 17 may be attached on the lid 20 side.

The lid 20 has a substantially rectangular shape and is attached to the front surface of the opening 11 of the container body 10. The lid 20 has a locking mechanism (not shown) and is locked by a latch claw engaged in a latch hole (not shown) formed in the container body 10. On a middle portion of the lid 20, an elastic front retainer (not shown) is detachably mounted or integrally formed. The front retainer holds a front peripheral edge of the substrate W horizontally.

Similarly to the groove teeth and the substrate retaining portions of the support body 13, this front retainer is a member to be in direct contact with the wafer. Hence, the front retainer is made of a material having good cleaning property and slidability. The front retainer can also be provided on the lid 20 by insert-molding, fitting and the like.

The lid 20 has an attachment groove 21 for attaching a packing 30. More specifically, a convex portion 22 is provided on a surface of the lid 20 on the container body 10 side. The convex portion 22 is formed so as to be annular and smaller than the stepped portion of the opening 11, thereby forming the attachment groove 21 with a substantially U-shaped cross section in an annular shape. When the lid 20 is attached to the container body 10, the convex portion 22 is inserted deeper than the stepped portion of the opening 11.

Examples of a material of the container body 10 and the lid 20 include a thermoplastic resin such as polycarbonate, polybutylene terephthalate, cycloolefin polymer, polyetherimide, polyether sulfone, polyether ether ketone and liquid crystal polymer. The thermoplastic resin may include a conductive agent such as conductive carbon, conductive fiber, metal fiber, conductive polymer; antistatic agents; and ultraviolet absorbers added appropriately.

Next, the packing 30 has an annular shape corresponding to a front shape of the lid 20 (and the shape of the opening 11 of the container body 10). In this embodiment, the packing 30 has a rectangular frame shape. However, the annular packing 30 may have a circular (ring) shape before the packing 30 is attached to the lid 20.

The packing 30 is disposed between the seal face 12 of the container body 10 and the lid 20. When the lid 20 is attached to the container body 10, the packing 30 is in close contact with the seal face 12 and the lid 20, thereby: securing the airtightness of the substrate storage container 1; reducing penetration of dust, moisture and the like from the outside into the substrate storage container 1; and reducing leakage of gas from the inside to the outside of the substrate storage container 1.

As a material of the packing 30, it is possible to use a thermoplastic elastomer such as a polyester-based elastomer, a polyolefin-based elastomer, a fluorine-based elastomer, a urethane-based elastomer and the like; or an elastic material such as a fluororubber, an ethylene propylene rubber and a silicone-based rubber. From the viewpoint of modifying adhesiveness, these materials may include a filler made of carbon, glass fiber, mica, talc, silica, calcium carbonate and the like; and a resin such as polyethylene, polyamide, polyacetal, a fluorine-based resin and a silicone resin, which are added selectively in a predetermined amount.

The filter 44 filters the gas to be supplied or exhausted. The filter 44 is selected from a porous membrane made of tetrafluoroethylene, polyester fiber, a fluororesin and the like; a molecular filtration filter made of glass fiber and the like, a chemical filter made of a filter medium (such as activated carbon fiber) carrying a chemical adsorbent; and others.

One or multiple filters 44 are held by the air supply unit 16 or the air exhaust unit 17. When multiple filters 44 are used, they may be of the same type. However, it is more preferable to combine those having different properties since contamination of an organic substance and the like other than particles can also be prevented. For example, the filters 44 also function to suppress transmission of fluid so that the fluid such as water or cleaning fluid does not remain when the container body 10 is cleaned. Hence, a hydrophobic or hydrophilic material may be used for one of the filters 44 in order to further suppress permeation of fluid.

Hereinafter, the valve(s) 40 will be described.

The valve(s) 40 control flow of gas relative to the container body 10. The valve(s) 40 are attached in a midway of the air supply flow passage 60 or the air exhaust flow passage 70, which are the gas flow passages.

FIG. 3A is a cross-sectional perspective view showing a structure of the valve 40. FIG. 3B is a cross-sectional view showing the structure of the valve 40.

As shown in FIGS. 3A and 3B, the valve 40 has: a cylindrical body 41 having an open edge 411 and an interior space 412; a stopcock portion 42 partitioning the interior space 412 into a first space 413 and a second space 414 and extending to the open edge 411; and an elastic body 43 covering the open edge 411 and the stopcock portion 42.

On a wall surface of the cylindrical body 41, a circular flange 415 is provided so as to protrude outward. An inner edge of the circular flange 415 forms the round-shaped open edge 411 which penetrates the wall surface of the cylindrical body 41. In the present embodiment, the round-shaped open edge 411, which is formed by the circular flange 415, is provided around an upper wall surface of the cylindrical body 41. However, the configuration is not limited thereto. For example, the open edge 411 may be provided on a lower wall surface of the cylindrical body 41.

The stopcock portion 42 is a plate-like member that partitions the interior space 412 into the first space 413 located on an outer side of the container body 10; and the second space 414 located on an inner side of the container body 10 as compared to the first space 413. The stopcock portion 42 stands on a wall surface 418 (the lower wall surface) facing the open edge 411 of the cylindrical body 41. In the present embodiment, the stopcock portion 42 is provided at a center position of the open edge 411 so as to extend along a radial direction while evenly partitioning the open edge 411 into two parts, when seen from a top view. The stopcock portion 42 has a tip edge 421 which is a flat surface.

The first space 413 has a first communication hole 416 (inner diameter: about Φ6) communicating with the outside of the container body 10. Concurrently, the second space 414 has a second communication hole 417 (inner diameter: about Φ6) communicating with the inside of the container body 10. In the present embodiment, the first communication hole 416 and the second communication hole 417 are respectively formed on one end side and the other end side of the cylindrical body 41. However, the configuration is not limited thereto. For example, the first and second communication holes 416, 417 may be formed in the wall surface 418 of the cylindrical body 41. In this case, both end sides of the cylindrical body 41 are closed by a lid or the like.

The first communication hole 416 communicates with one end side of the first air supply flow passage 61 or the first air exhaust flow passage 71 that are in communication with the outside of the container body 10. The second communication hole 417 communicates with one end side of the second air supply flow passage 62 or the second air exhaust flow passage 72 that are in communication with the inside of the container body 10.

The above-described cylindrical body 41 and stopcock portion 42 are molded using a thermoplastic resin such as polycarbonate, polyetherimide, polyether ether ketone and liquid crystal polymer as a non-metallic material.

The elastic body 43 controls flow of gas relative to the container body 10 by closely contacting the tip edge 421 of the stopcock portion 42 or by separating from the tip edge 421 of the stopcock portion 42. The elastic body 43 comprises a disk-shaped base 431 covering the open edge 411 and the stopcock portion 42.

A circular restraining portion 1011 is provided on an inner bottom surface portion 101. The restraining portion 1011 is detachably attached to the cylindrical body 41 via the elastic body 43 to press the elastic body 43 onto the cylindrical body 41. In the present embodiment, the elastic body 43 is detachably attached to the cylindrical body 41 by the restraining portion 1011, but the configuration is not limited thereto. For example, the elastic body 43 may be directly attached to the cylindrical body 41 by bonding or welding.

The elastic body 43 is provided so as to have a gap against the inner bottom surface portion 101 of the container body 10 when the elastic body 43 is in close contact with the tip edge 421 of the stopcock portion 42. This allows the elastic body 43 to bulge and separate from the tip edge 421 of the stopcock portion 42.

The elastic body 43 securely seals the open edge 411 on the first space 413 side and the tip edge 421 of the stopcock portion 42 as well as the tip edge 421 of the stopcock portion 42 and the open edge 411 on the second space 414 side so that supplied or exhausted gas only flows through the first space 413 and the second space 414.

The elastic body 43 may be molded of a non-metallic material. The non-metallic material may be rubbers, thermoplastic elastomers and the like. For example, it is possible to use a thermoplastic elastomer such as a polyester-based elastomer, a polyolefin-based elastomer, a fluorine-based elastomer, a urethane-based elastomer; a fluororubber; an ethylene propylene rubber; and a silicone-based rubber.

Lastly, it will be described how the valve(s) 40 control the flow of gas.

Figure 4A:
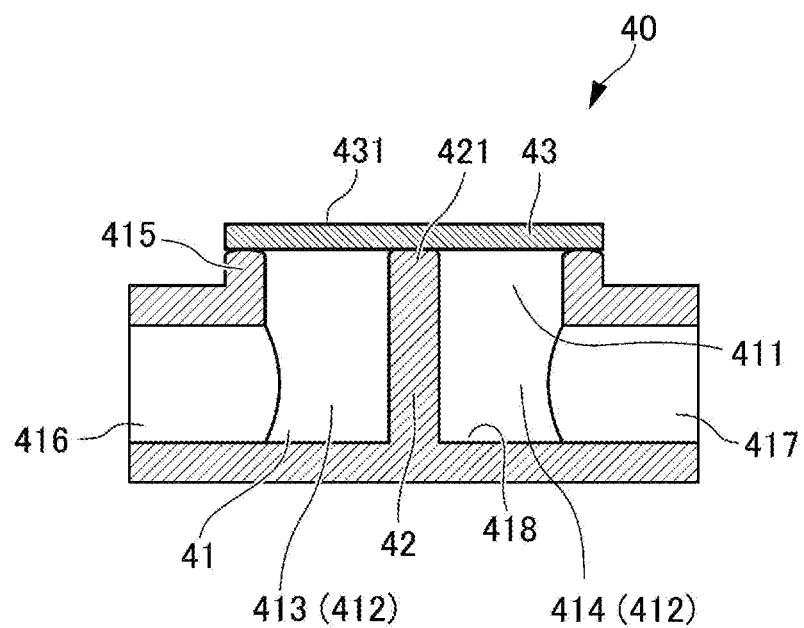
FIG. 4A is a schematic cross-sectional view showing the valve attached to the substrate storage container in a state where flow of gas is blocked.
Figure 4B:
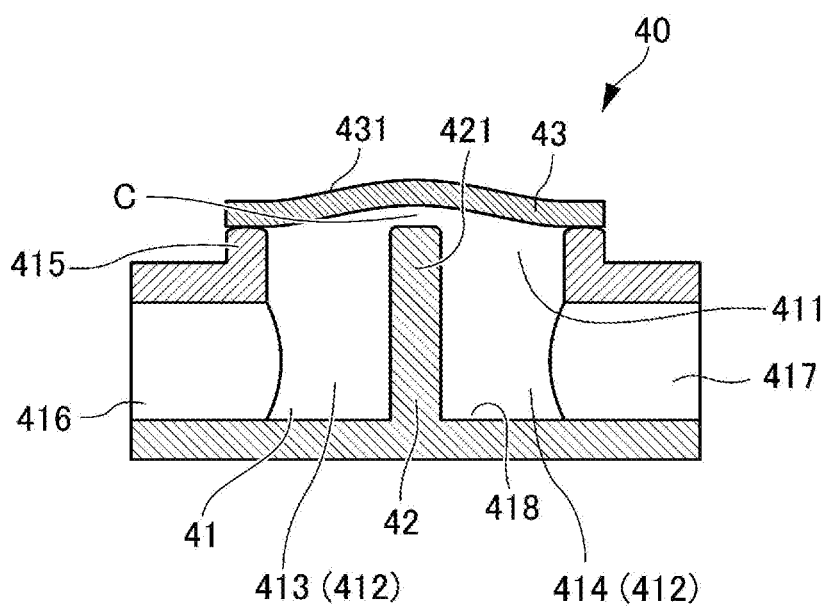
FIG. 4B is a schematic cross-sectional view showing the valve attached to the substrate storage container in a state where the flow of gas is enabled.

FIG. 4A is a schematic cross-sectional view showing the valve 40 attached to the substrate storage container 1 in a state where the gas flow is blocked. FIG. 4B is a schematic cross-sectional view showing the valve 40 attached to the substrate storage container 1 in a state where the gas flow is enabled.

In FIG. 4A, when positive pressure is not applied to the first space 413 and the second space 414, the elastic body 43 stays in close contact with the tip edge 421 of the stopcock portion 42, blocking the flow of gas.

For example, as indicated in FIG. 4B, when a positive pressure of a predetermined value or more is applied to the first space 413, the elastic body 43 is elastically deformed to bulge according to the size of the positive pressure, forming a clearance C against the tip edge 421 of the stopcock portion 42. Gas from the first space 413 side passes through the clearance C and flows to the second space 414 side to be supplied to the inside of the container body 10.

For example, as indicated in FIG. 4(*b*), when a positive pressure of a predetermined value or more is applied to the first space 413, the elastic body 43 is elastically deformed to bulge according to the size of the positive pressure, forming a clearance C against the tip edge 421 of the stopcock portion 42. Gas from the first space 413 side passes through the clearance C and flows to the second space 414 side to be supplied to the inside of the container body 10.

Reversely, even when a positive pressure of a predetermined value or more is applied to the second space 414, the elastic body 43 similarly bulges to form the clearance C against the tip edge 421 of the stopcock portion 42. Gas from the second space 414 side passes through this clearance C and flows to the first space 413 side to be exhausted to the outside of the container body 10.

In this manner, the valve(s) 40 of the present embodiment are not only capable of blocking or enabling gas flow from either one side, but are capable of blocking or enabling gas flow in both directions. The predetermined value of pressure for enabling gas flow can be adjusted by changing the material, hardness and thicknesses of the elastic body 43; the position of the stopcock portion 42 in an extending direction of the cylindrical body 41; and the geometry of the tip edge 421 of the stopcock portion 42.

As described above, the substrate storage container 1 according to the embodiment of the present invention includes: the container body 10 for storing the substrate W; the lid 20 for closing the opening 11 of the container body 10; and the valve(s) 40 for controlling flow of gas relative to the container body 10. The valve(s) 40 are attached in a midway of the gas flow passage provided to the container body 10. Each valve 40 has: the cylindrical body 41 having the open edge 411 and the interior space 412; the stopcock portion 42 partitioning the interior space 412 into the first space 413 and the second space 414 and extending to the open edge 411; and the elastic body 43 covering the open edge 411 and the stopcock portion 42. The first space 413 has a first communication hole 416 communicating with the outside of the container body 10, and the second space 414 has a second communication hole 417 communicating with the inside of the container body 10. The elastic body 43 controls the flow of the gas relative to the container body 10 by closely contacting the stopcock portion 42 or separating from the stopcock portion 42.

Accordingly, when the gas is introduced (causing positive pressure) from one of the first space 413 and the second space 414 of the valve 40 and reaches a predetermined value of pressure, the elastic body 43 bulges to form the clearance C against the tip edge 421 of the stopcock portion 42, so that the introduced gas is supplied to the other of the first space 413 and the second space 414 of the valve 40.

Since the substrate storage container 1 includes the valve(s) 40 which do not use any metallic member, metallic corrosive residual materials, if any, on the substrate W to be stored do not cause metallic corrosion problems, and it is unlikely that the valve(s) 40 become inoperative.

Further, since the substrate storage container 1 includes the valve(s) 40 that control bidirectional gas flow, it is possible to accommodate any gas supply and exhaust route regardless of the positions or the number of the air supply unit 16 and the air exhaust unit 17 only by appropriately attaching this type of valves 40 in a midway of the gas flow passage.

In addition, a humidity retention test was carried out using the substrate storage container 1 of the embodiment, resulting in no significant distinction in humidity reduction over time as compared with conventional ones.

Note that the distance is long from the gas introduction portion 50 or the air supply flow passage 60 via the first air supply flow passage 61 or the first air exhaust flow passage 71 to the valve 40. Hence, even when the container body 10 is cleaned with fluid, the fluid hardly reaches the valve 40, thereby preventing residual fluid after drying the container body 10. In addition, no fluid reaches the air supply unit 16 or the air exhaust unit 17 which are on the deeper side of the valve 40 (the stopcock portion 42).

A preferred embodiment of the present invention has been described in detail above. However, the present invention is not limited to the above-described embodiment, and various variations and modifications can be made within the scope of the gist of the present invention described in the appended claims.

(Variants)

Hereinafter, a variant of the embodiment will be described.

Figure 5:
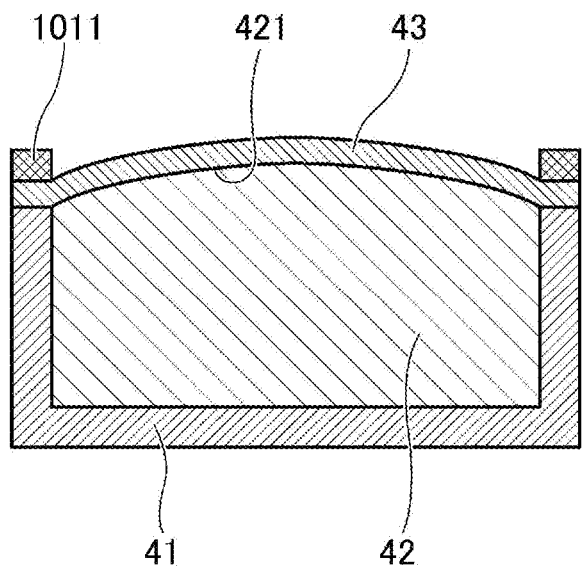
FIG. 5 is a schematic diagram showing a shape of a tip edge of a stopcock portion of a variant.
Figure 6:
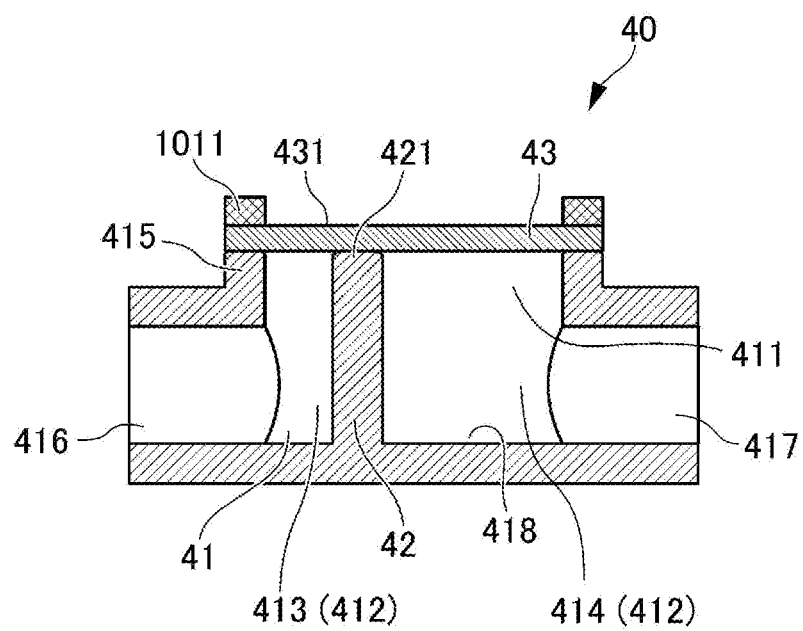
FIG. 6 is a cross-sectional view showing an arrangement of the stopcock portion in the variant.

FIG. 5 is a schematic diagram showing a shape of a tip edge 421 of a stopcock portion 2 of the variant. FIG. 6 is a cross-sectional view showing an arrangement of the stopcock portion 2 in the variant.

In the above embodiment, the first space 413 and the second space 414 respectively have one first communication hole 416 and one second communication hole 417. However, the configuration is not limited thereto. For example, the first space 413 and the second space 414 may each include two or more first communication holes 416 and/or two or more second communication holes 417, depending on the application of the valve(s) 40.

In the above embodiment, the open edge 411 has a round shape, but the shape is not limited thereto. For example, the open edge 411 may have an elliptical shape, a triangular shape or a square shape. In these cases, the shape of the elastic body 43 may also be appropriately changed in accordance with the shape of the open edge 411.

Further, in the above embodiment, the tip edge 421 of the stopcock portion 42 is flat, but the shape is not limited thereto. For example, as shown in FIG. 5, the tip edge 421 may be a surface of any shape such as a curved surface of which central portion is raised toward the elastic body 43 side. In this case, the elastic body 43 is biased upward by the tip edge 421 having the raised central portion. Hence, it is possible to raise the predetermined value of pressure to enable gas flow as compared with the value of the flat tip edge 421.

In the above embodiment, the stopcock portion 42 is provided at the center position of the open edge 411, but the position is not limited thereto. For example, as shown in FIG. 6, the stopcock portion 42 may be deviated in the extending direction of the cylindrical body 41 from the center position of the open edge 411. In this case, the predetermined value of pressure to enable gas flow is adjusted.

Second Embodiment

In the above embodiment, the valve(s) 40 are configured to be attached in a midway of the gas flow passage of the container body 10. However, the configuration is not limited thereto. For example, the valve(s) 40 may be configured to be attached on at least one of the container body 10 and the lid 20.

Figure 7:
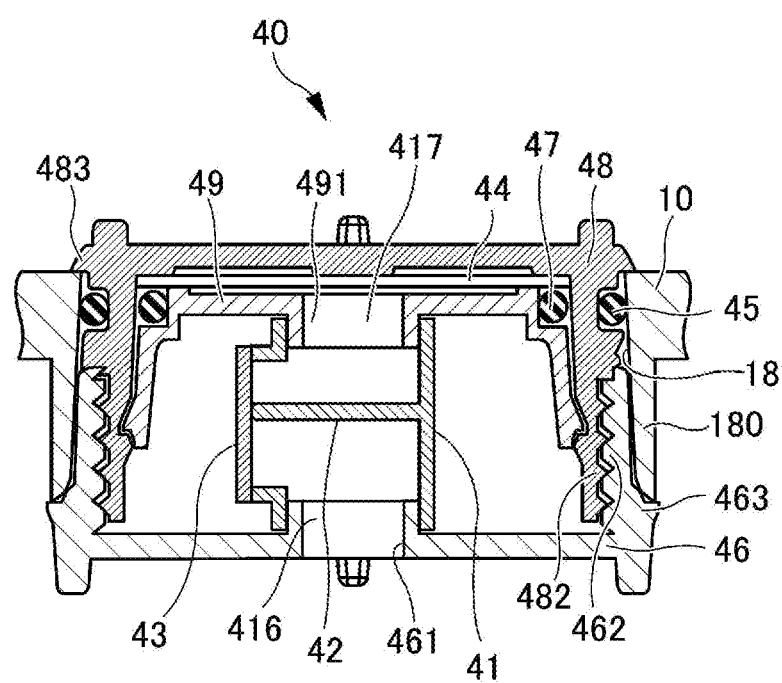
FIG. 7 is a cross-sectional view showing a valve of a container body of a second embodiment.

FIG. 7 is a cross-sectional view showing the valve 40 of the container body 10 of a second embodiment.

As shown in FIG. 7, the valve 40 has a fixation cylinder 46 and a holding cylinder 48. The fixation cylinder 46 is fitted from below into a through hole 18 formed by a rib 180 of the container body 10. The holding cylinder 48 is fitted from above via a seal member 45 into the through hole 18. The holding cylinder 48 is detachably combined with the fixation cylinder 46 from above by screwing.

The fixation cylinder 46 has a bottomed cylindrical shape with an opening on the inner side of the container body 10. On an inner peripheral surface of the fixation cylinder 46, thread grooves 462 for attaching the holding cylinder 48 are threadably formed. On an outer peripheral surface of the fixation cylinder 46, a ring-shaped flange 463 extending radially outward is circumferentially provided so as to contact an open peripheral portion of the rib 180. Further, the fixation cylinder 46 has, at a center of a bottom portion, a vent 461 for gas flow communicating with the first communication hole 416 of the cylindrical body 41.

On the other hand, the holding cylinder 48 has a bottomed cylindrical shape with an opening on the outer side of the container body 10. On an outer peripheral surface of the holding cylinder 48, a ring-shaped flange 483 extending radially outward is circumferentially provided so as to contact an open peripheral portion of the through hole 18. On the outer peripheral surface of the holding cylinder 48, thread grooves 482 for its attaching to the fixation cylinder 46 are threadably formed. These thread grooves 482 are screwed with the thread grooves 462 of the fixation cylinder 46. However, the fixation cylinder 46 and the holding cylinder 48 may be attached to each other in other manners such as press fitting and engagement other than screwing.

The holding cylinder 48 is provided with partition ribs (not shown) for partitioning multiple vents for gas flow (not shown) on the inner side of the container body 10 (bottom surface). The partition ribs are arranged in a grid manner or radially. On a rear surface of the partitioning ribs, a storage space for storing the filter 44 is formed.

Attached on the outer peripheral surface of the holding cylinder 48 is a seal member 45. The seal member 45 blocks outside air or cleaning fluid from entering the inside of the container body 10 from between the holding cylinder 48 and an inner peripheral surface of the through hole 18. The seal member 45 also blocks gas leakage from the inside of the container body 10.

The valve 40 is attached to an inner peripheral wall of the holding cylinder 48 via a seal member 47. The valve 40 also has an inner lid cylinder 49. The inner lid cylinder 49 and the holding cylinder 48 hold the filter 44 therebetween.

The inner lid cylinder 49 has a bottomed cylindrical shape with an opening on the outer side of the container body 10. The inner lid cylinder 49 is formed such that the filter 44 is placed on the inner side of the container body 10. On an outer peripheral surface of the inner lid cylinder 49, a protrusion is formed to engage with an engagement groove formed on an inner peripheral surface side of the holding cylinder 48. The inner lid cylinder 49 is thus connected and attached to the holding cylinder 48. The inner lid cylinder 49 has, at a center of a bottom portion, a vent 491 for gas flow communicating with the second communication hole 417 of the cylindrical body 41.

The valve 40 has a cylindrical body 41 disposed between the fixation cylinder 46 and the inner lid cylinder 49 and having an open edge 411 and an interior space 412; a stopcock portion 42 partitioning the interior space 412 into a first space 413 and a second space 414 and extending to the open edge 411; and an elastic body 43 covering the open edge 411 and the stopcock portion 42. In this embodiment, the cylindrical body 41, the stopcock portion 42 and the elastic body 43 are the same as those in the above embodiment, so that their descriptions are omitted.

The fixation cylinder 46, the holding cylinder 48 and the inner lid cylinder 49 described above are molded using as a material, for example, a thermoplastic resin such as polycarbonate, polyetherimide, polyether ether ketone and liquid crystal polymer. Used as the seal members 45, 47 are an O-ring and the like formed of a material such as fluororubber, NBR rubber, urethane rubber, EPDM rubber or silicone rubber.

The substrate storage container 1 of the second embodiment also includes the valve(s) 40 which do not use any metallic member. Hence, metallic corrosive residual materials, if any, on the substrate W to be stored do not cause metallic corrosion problems, and it is unlikely that the valve(s) 40 become inoperative.

Variant of the Second Embodiment

In the above embodiment, the holding cylinder 48 is combined inside the fixation cylinder 46 fitted into the through hole 18. Reversely, the fixation cylinder 46 may be combined inside the holding cylinder 48 fitted into the through hole 18. In the above embodiment, the valve(s) 40 have the inner lid cylinder 49. However, the valve(s) 40 may not have the inner lid cylinder 49 and the second communication hole 417 may communicate with the holding cylinder 48. In this case, it is good that the filter 44 is directly bonded or welded to the holding cylinder 48.

REFERENCE SIGNS LIST

1 . . . substrate storage container,
10 . . . container body; 11 . . . opening; 12 . . . seal face; 13 . . . support body; 14 . . . robotic flange; 15 . . . manual handle; 16 . . . air supply unit; 17 . . . air exhaust unit; 18 . . . through hole; 101 . . . inner bottom surface portion; 102 . . . outer bottom plate; 180 . . . rib; 1011 . . . restraining portion,
20 . . . lid; 21 . . . attachment groove; 22 . . . convex portion,
30 . . . packing,
40 . . . valve;
  41 . . . cylindrical body; 411 . . . open edge; 412 . . . interior space; 413 . . . first space; 414 . . . second space; 415 . . . flange; 416 . . . first communication hole; 417 . . . second communication hole; 418 . . . wall surface;
  42 . . . stopcock portion; 421 . . . tip edge;
  43 . . . elastic body; 431 . . . base;
  44 . . . filter; 45 . . . seal member; 47 . . . seal member;
  46 . . . fixation cylinder; 461 . . . vent; 462 . . . thread groove; 463 . . . flange;
  48 . . . holding cylinder; 482 . . . thread groove; 483 . . . flange;
  49 . . . inner lid cylinder; 491 . . . vent,
50 . . . gas introduction portion,
51 . . . gas exhaust portion,
60 . . . air supply flow passage; 61 . . . first air supply flow passage; 62 . . . second air supply flow passage,
70 . . . air exhaust flow passage; 71 . . . first air exhaust flow passage; 72 . . . second air exhaust flow passage,
W . . . substrate,
C . . . clearance.

The invention claimed is:

1. A substrate storage container, comprising:
a container body for storing a substrate;
a lid for closing an opening of the container body; and
a valve for controlling flow of gas relative to the container body,
wherein the valve has:
  a cylindrical body having an open edge and an interior space;
  a stopcock portion partitioning the interior space into a first space and a second space and extending to the open edge; and
  an elastic body covering the open edge and the stopcock portion,
wherein the first space has a first communication hole communicating with an outside of the container body, and the second space has a second communication hole communicating with an inside of the container body, and
wherein the elastic body controls the flow of the gas relative to the container body by closely contacting the stopcock portion or separating from the stopcock portion.

2. The substrate storage container according to claim 1, wherein
the elastic body has a plate-like shape and seals between the open edge above the first space and the stopcock portion and between the stopcock portion and the open edge above the second space so that the gas flows only through the first space and the second space.

3. The substrate storage container according to claim 1, wherein
the elastic body enables the flow of the gas relative to the container body by bulging to form a clearance against the stopcock portion when positive pressure is applied to the first space or the second space, and blocks the flow of the gas relative to the container body by closely contacting the stopcock portion when the positive pressure is not applied to the first space and the second space.

4. The substrate storage container according to claim 1, wherein
the elastic body is detachably attached to the cylindrical body.

5. The substrate storage container according to claim 1, wherein
the valve is attached in a midway of a gas flow passage provided to the container body.

6. The substrate storage container according to claim 1, wherein
the first communication hole communicates with a fixation cylinder fitted in a through hole formed in the container body, and
wherein the second communication hole communicates with a holding cylinder combined with the fixation cylinder.

7. The substrate storage container according to claim 1, wherein
the first communication hole communicates with a fixation cylinder fitted in a through hole formed in the container body, and
wherein the second communication hole communicates with an inner lid cylinder connected to a holding cylinder combined with the fixation cylinder.

8. The substrate storage container according to claim 6, wherein
the valve has a filter for filtering the gas.

9. The substrate storage container according to claim 7, wherein
the valve has a filter for filtering the gas.

* * * * *